United States Patent
Happ et al.

(10) Patent No.: US 7,400,528 B2
(45) Date of Patent: Jul. 15, 2008

(54) INTERGRATED CIRCUIT FOR PROGRAMMING RESISTIVE MEMORY CELLS

(75) Inventors: Thomas Happ, Tarrytown, NY (US); Michael Kund, Tuntenhausen (DE)

(73) Assignee: Qimonda AG, Munich (DE)

( * ) Notice: Subject to any disclaimer, the term of this patent is extended or adjusted under 35 U.S.C. 154(b) by 127 days.

(21) Appl. No.: 11/515,421

(22) Filed: Sep. 5, 2006

(65) Prior Publication Data

US 2007/0053224 A1 Mar. 8, 2007

Related U.S. Application Data

(63) Continuation of application No. PCT/DE2005/000723, filed on Apr. 20, 2005.

(30) Foreign Application Priority Data

Apr. 23, 2004 (DE) ........................ 10 2004 019 860

(51) Int. Cl.
*G11C 11/34* (2006.01)
(52) U.S. Cl. .................. 365/185.03; 365/158; 365/148

(58) Field of Classification Search ............ 365/185.03, 365/158, 148, 189.07, 46, 49, 171, 173
See application file for complete search history.

(56) References Cited

U.S. PATENT DOCUMENTS

| | | | |
|---|---|---|---|
| 5,883,827 A | * | 3/1999 | Morgan ...................... 365/100 |
| 7,088,608 B2 | * | 8/2006 | DeHerrera et al. .......... 365/158 |
| 2003/0185036 A1 | | 10/2003 | Gilton et al. |
| 2003/0209971 A1 | | 11/2003 | Kozicki |

FOREIGN PATENT DOCUMENTS

| EP | 1482513 A2 | 12/2004 |
|---|---|---|
| GB | 1308711 | 3/1973 |

* cited by examiner

*Primary Examiner*—Richard T. Elms
*Assistant Examiner*—Dang Nguyen
(74) *Attorney, Agent, or Firm*—Dicke, Billig & Czaja PLLC

(57) ABSTRACT

Methods and devices for programming conductive bridging RAM (CBRAM) memory cells improve the cycle stability by ensuring that the memory cells are erased before being written to anew. Optionally, in the event of overwriting the memory cells, memory cells may be written to only when the writing operation would alter the cell content (i.e., the state of bit stored in the memory cell is being changed from a logical 0 to a logical 1 or vice versa).

20 Claims, 8 Drawing Sheets

"0" (OFF)

High-resistance

"1" (ON)

Low-resistance

"0"

WRITING "1"

"1"

"1"

ERASURE

"0"

FIG 7A
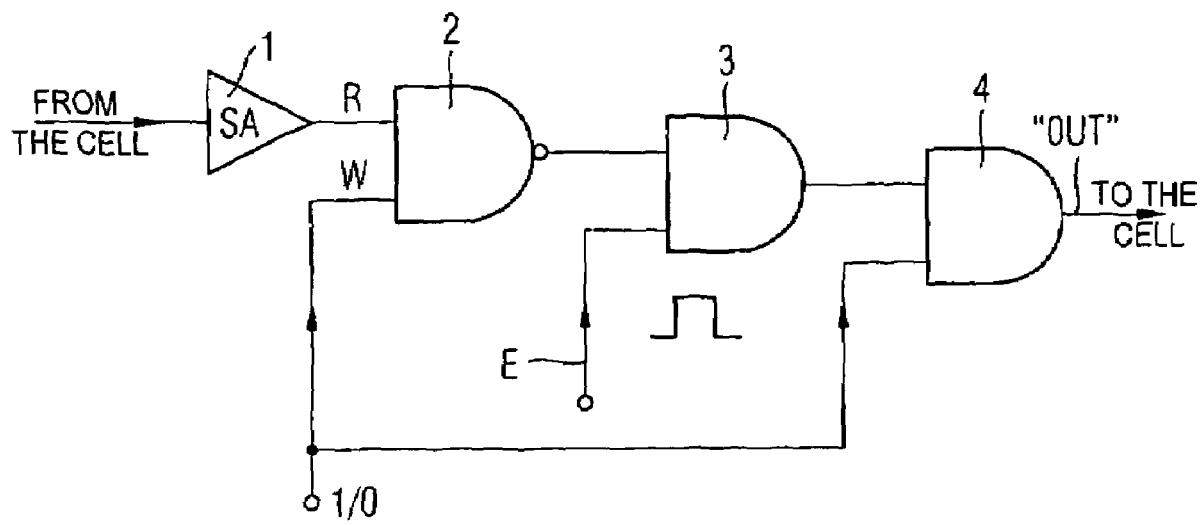
FIG 7B
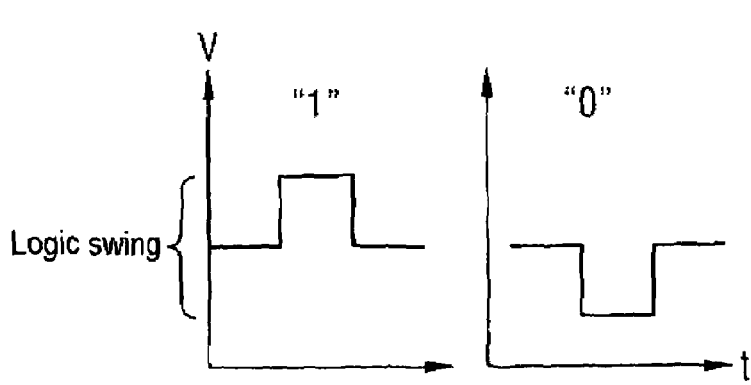
FIG 7C

FIG 8A
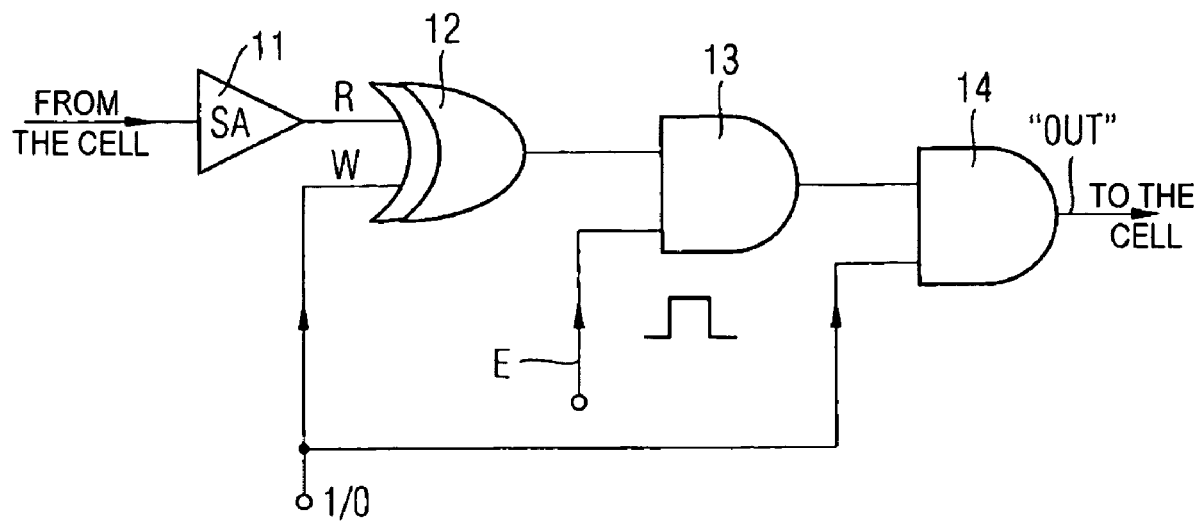
FIG 8B
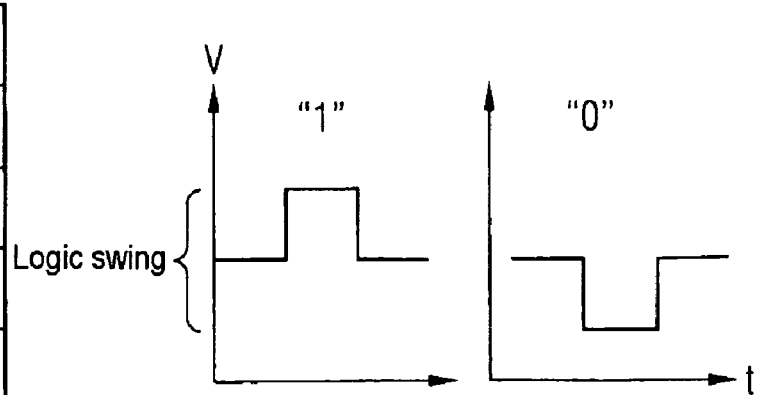
FIG 8C

INTERGRATED CIRCUIT FOR PROGRAMMING RESISTIVE MEMORY CELLS

CROSS REFERENCE TO RELATED APPLICATIONS

This application is a continuation of International Application No. PCT/DE2005/000723, filed on Apr. 20, 2005, entitled "Method and Device for Programming CBRAM Memory Cells," which claims priority under 35 U.S.C. §119 to Application No. DE 10 2004 019 860.8 filed on Apr. 23, 2004, entitled "Method and Device for Programming CBRAM Memory Cells," the entire contents of which are hereby incorporated by reference.

BACKGROUND

"Conductive bridging" memory cells (CBRAM) constitute a new and promising technology for semiconductor-based memory components. In the future, products based on CB technology are possible as a replacement both for flash memories and for DRAM memories. R. Symanczyk et al. describe in "Electrical characterization of solid state ionic memory elements" in Non-Volatile Memory Technology Symposium (NVMTS'03), San Diego, 2003, the electrical properties of memory elements based on so-called solid electrolytes, these elements also being called programmable metallization cells, or PMC when abbreviated, on account of their operating principle. In memory cells of this type, a vitreous or porous layer, for example made of chalcogenide glass such as GeSe, GeS or made of AgSe, CuS, WOx, etc., is situated between a metal electrode serving as ion donor, for example made of Cu, Ag, Au, Zn, and a counterelectrode made of inert material, for example W, Ti, Ta, TiN, doped Si or Pt. When a voltage or current pulse is applied between the electrodes, metal ions are driven into the chalcogenide glass by a redox reaction and form metal-enriched clusters, with the result that, given a sufficient metal concentration, a conductive bridge is formed between the two electrodes, which forms a low-resistance or "on" state of the memory cell. An electrical current or voltage pulse having opposite polarity inverts the redox reaction, so that the metal ions are drawn from the chalcogenide glass and the metal-enriched clusters are reduced. In this way, the metallically conductive bridge is terminated, and a high-resistance or "off" state of the memory cell then forms.

The accompanying FIGS. 1A and 1B schematically illustrate the above mentioned possible states of such a CBRAM memory cell 1, namely the high-resistance or off state in FIG. 1A and the low-resistance or on state in FIG. 1B, it being possible for the high-resistance state to be assigned for example to the logic state "0" and the low-resistance state to the logic "1" state. FIGS. 2A and 2B schematically illustrate a write operation for writing a logic "1" by application of a current or voltage pulse to the CBRAM memory cell 1, while FIGS. 2C and 2D schematically illustrate an erase operation in which a CBRAM memory cell 1 in the low-resistance or on state is put into the high-resistance or off state (FIG. 2D) by application of a current or voltage pulse having opposite polarity.

The suitability of such memory cells for high-density and fast nonvolatile memories has been recognized and investigated in the specialist report mentioned above.

For reliable operation over relatively long times, special programming and erasure strategies are necessary in order to guarantee the cycle stability. The accompanying FIG. 3 graphically shows the result of a typical cycle test such as occurs with an inadequately calibrated erase operation: the number of cycles with which the CBRAM cell was cycled is plotted on the abscissa axis and the electrical resistance of the CBRAM cell is plotted on the ordinate axis. Since the on state was written to a greater degree than erased, the resistance of the off state thus generated degrades with an increasing number of cycles. It is thus clear that in the extreme case, direct repeated writing of a logic "1" state corresponding to the on state in CBRAM memory cells causes serious write imprint and the cell would be very rapidly destroyed.

SUMMARY

Described herein is a method and a device for programming CBRAM memory cells in which repeated writing of a logic "1" corresponding to the low-resistance cell state to a CBRAM memory cell can be avoided and premature destruction of the cell by write imprint can thus be prevented.

BRIEF DESCRIPTION OF THE DRAWINGS

The programming method according to the invention and the devices according to the invention for programming CBRAM memory cells are explained in more detail below with reference to the drawings, wherein like reference numerals in the various figures are utilized to designate like components:

FIGS. 7A, 7B and 7C respectively show a schematic circuit diagram, a truth table and pulse shapes fed to the cell for the programming device corresponding to the third aspect of the invention;

FIGS. 8A, 8B, 8C respectively show a schematic circuit diagram, a truth table and pulse shapes of a programming device corresponding to the fourth aspect of the invention.

DETAILED DESCRIPTION

Figure 1A:
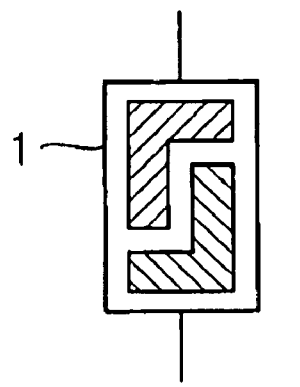
FIGS. 1A and 1B schematically and symbolically show the high-resistance off state and low-resistance on state of a CBRAM memory cell.
Figure 1B:
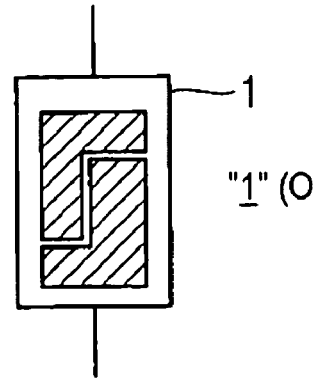

A first method for programming CBRAM memory cells involves putting the memory cells into a low-resistance or on state corresponding to a first logic state by application of a write pulse having a specific polarity and into a high-resistance or off state corresponding to a second logic state by application of an erase pulse having opposite polarity, an erase pulse being applied to each memory cell to be programmed before a write pulse with which the memory cell is intended to be put into the first logic state.

A first device for carrying out the above method includes a command generator which receives a write request signal and an enable signal from a memory control unit and outputs command signals corresponding to the signals in the write cycle, with which command signals a respective switch can be opened or closed, the switch inputs respectively having applied to them a write pulse, an erase pulse and a center level and applying these input signals of the memory cell depending on their "open" and "closed" state.

A second device for programming CBRAM memory cells, in which the memory cells can be put into a low-resistance or on state corresponding to a first logic state by application of a write pulse having a specific polarity and into a high-resistance or off state corresponding to a second logic state by application of an erase pulse having opposite polarity, includes an evaluation logic that compares a cell content read out from a memory cell that is respectively to be written to with a datum to be stored and always feeds an erase pulse to the memory cell in the write cycle if the datum to be stored is equal to the second logic state and feeds a write pulse for writing a datum corresponding to the first logic state if the comparison by the evaluation logic reveals that the logic value of the cell content read out differs from the datum to be stored. In this device, the evaluation logic preferably has a NAND element in order to carry out a logic NAND combination of the cell content read out with the datum that is respectively to be stored.

A third device for programming CBRAM memory cells, which can be put into a low-resistance or on state corresponding to a first logic state by application of a write pulse having a specific polarity and into a high-resistance or off state corresponding to a second logic state by application of an erase pulse having opposite polarity, includes an evaluation logic that compares a cell content read out from a memory cell that is respectively to be written to with a datum to be stored and feeds a write pulse to the memory cell in the write cycle only when the comparison reveals that the logic value of the cell content read out differs from a datum to be stored, if a datum corresponding to the first logic value is to be stored, and feeds an erase pulse if a datum corresponding to the second logic value is to be stored. In this device, the evaluation logic preferably has an exclusive-OR element in order to carry out a logic "exclusive-OR" combination of the cell content read out with the datum that is respectively to be stored.

The programming method corresponding to the first device ensures that memory cells are always erased before being written to anew. In the programming method corresponding to the first device, the write processes are composed of one operation in 50% of all cases and of two operations in 50% of all cases. By contrast, one read operation always and one write operation in 50% of all cases are necessary in the second and third programming devices. As a result, in the second and third devices, the number of write operations, in particular, is reduced, the write operations bringing about a significantly greater loading of the memory cell than read processes on account of the significantly higher voltages and currents. In the second and third programming devices, the evaluation logic achieves the effect that the cell content is altered in the event of overwriting only if this is actually necessary on account of a changing bit state. As a result, from standpoints of speed, the programming method corresponding to the first device matches the mode of functioning of the second and third devices since (assuming read and write cycles of equal length) on average 1.5 operations per write access are required.

In comparison with directly overwriting of cells, the programming method according to the invention requires more time, but in return enables a long cycle stability of the memory cells. In addition, the second and third programming devices have the potential for a reduced energy requirement, depending on the written data or data to be written.

Figure 2A:
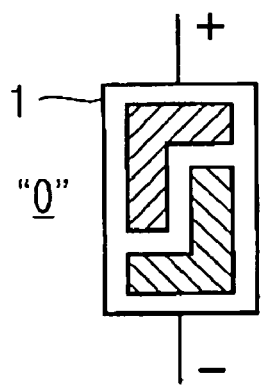
FIGS. 2A-2D schematically show the different states of a CBRAM memory cell during the writing of a logic "1" and during the erase process.
Figure 2B:
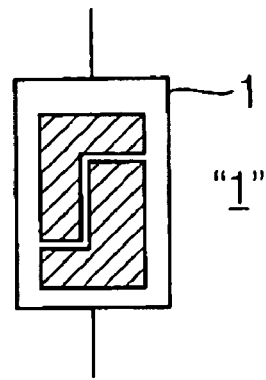
Figure 2C:
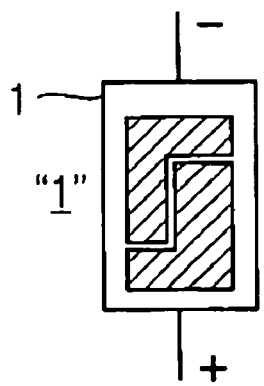
Figure 2D:
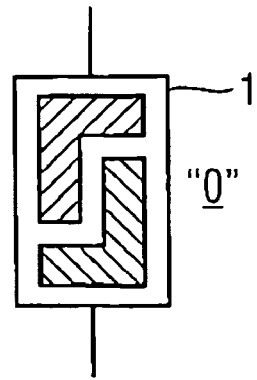
Figure 3:
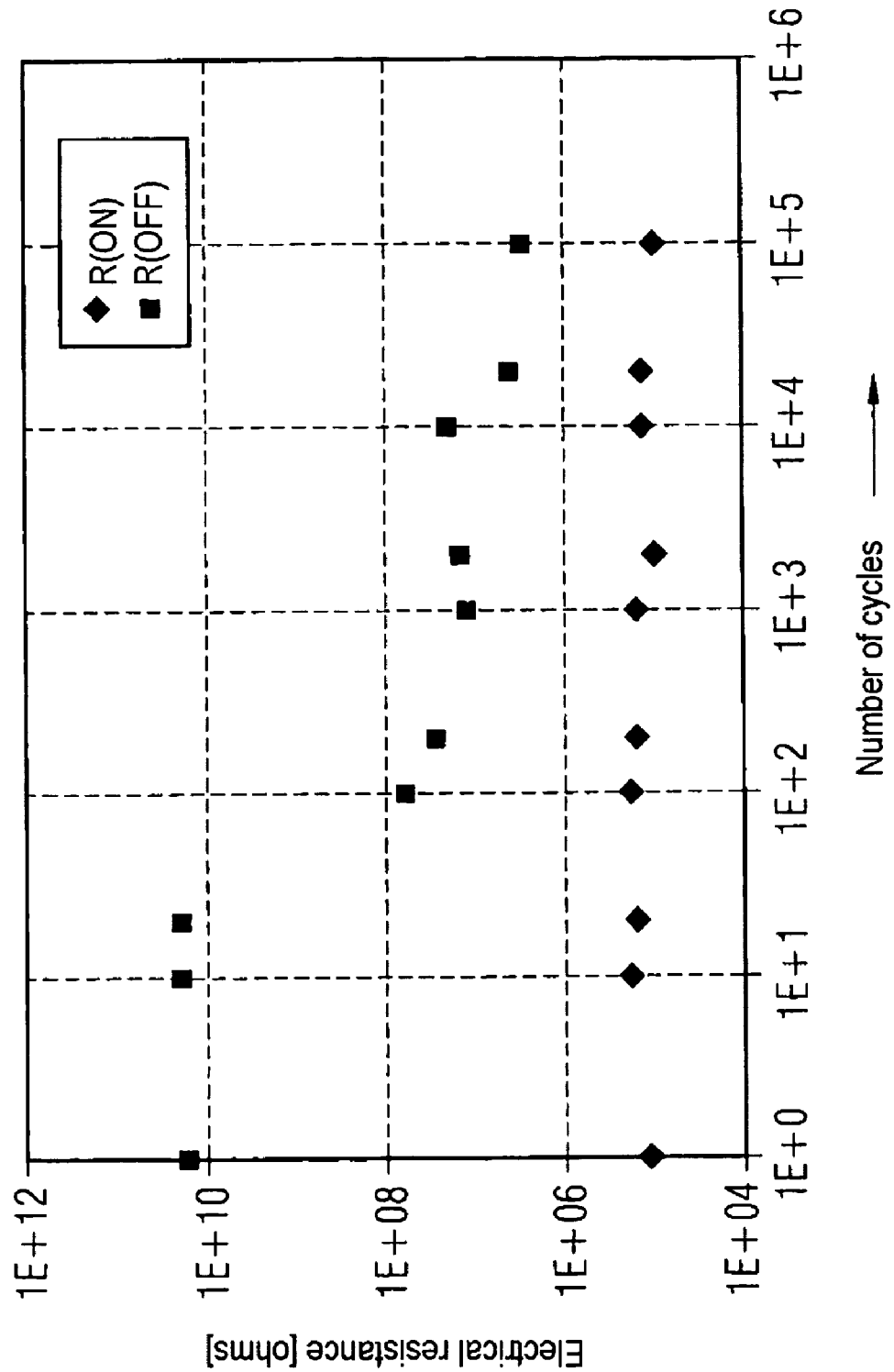
FIG. 3 graphically shows results of a cycle test of CBRAM memory cells.

Exemplary embodiments will now be described in connection with FIGS. 4-8D. In the method for programming CBRAM memory cells which is illustrated in the form of a schematic flow diagram in FIG. 4 and corresponds to the first embodiment, the instantaneous state of the CBRAM memory cells is always erased before they are written to anew and the memory cell is put into the off state (cf. FIGS. 2C and 2D described in the introduction). This is possible without problems since CBRAM cells exhibit no erase imprint (cf. the document mentioned in the introduction). In this case, the command sequence provides that after the write request (S1) and the identification or interrogation of whether a "1" or "0" is being written (S2), firstly an erase pulse is always output to the selected cell (S3 and S4) and the subsequent write pulse (S5) follows only in the case where a "1" is intended to be written. This eliminates the risk of the write imprint for the "1" datum.

Figure 5:
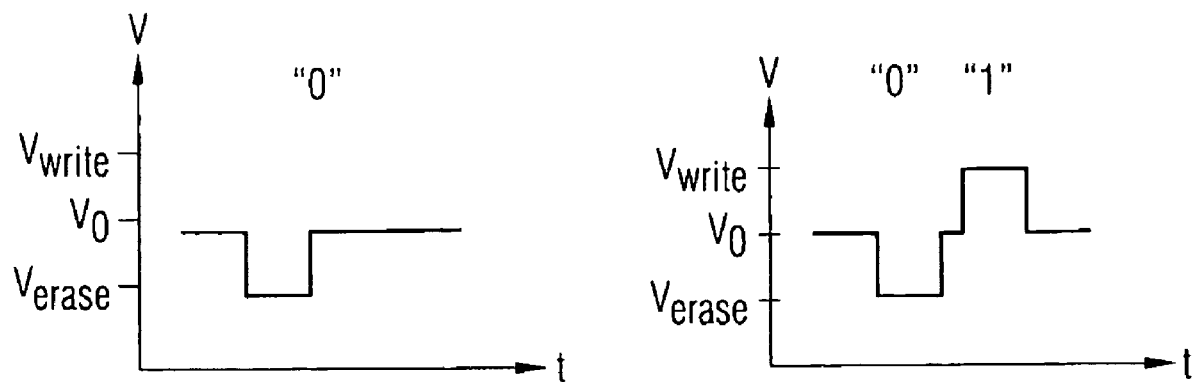
FIG. 5 shows a schematic pulse diagram of the pulses fed to the cell in each case for erasing ("0") and for writing a logic ("1")

FIG. 5 shows, on the left, an example of an erase pulse "0" fed to a memory cell, whereas, on the right, FIG. 5 shows a pulse diagram for the case where a "1" is written to the memory cell. As shown, the erase pulse $V_{erase}$ and the write pulse $V_{write}$ have opposite polarities and proceed from a center or zero level. Furthermore, the right-hand part of FIG. 5 shows that each write pulse with which a "1" is programmed into the memory cell is preceded by an erase pulse $V_{erase}$.

Figure 4:
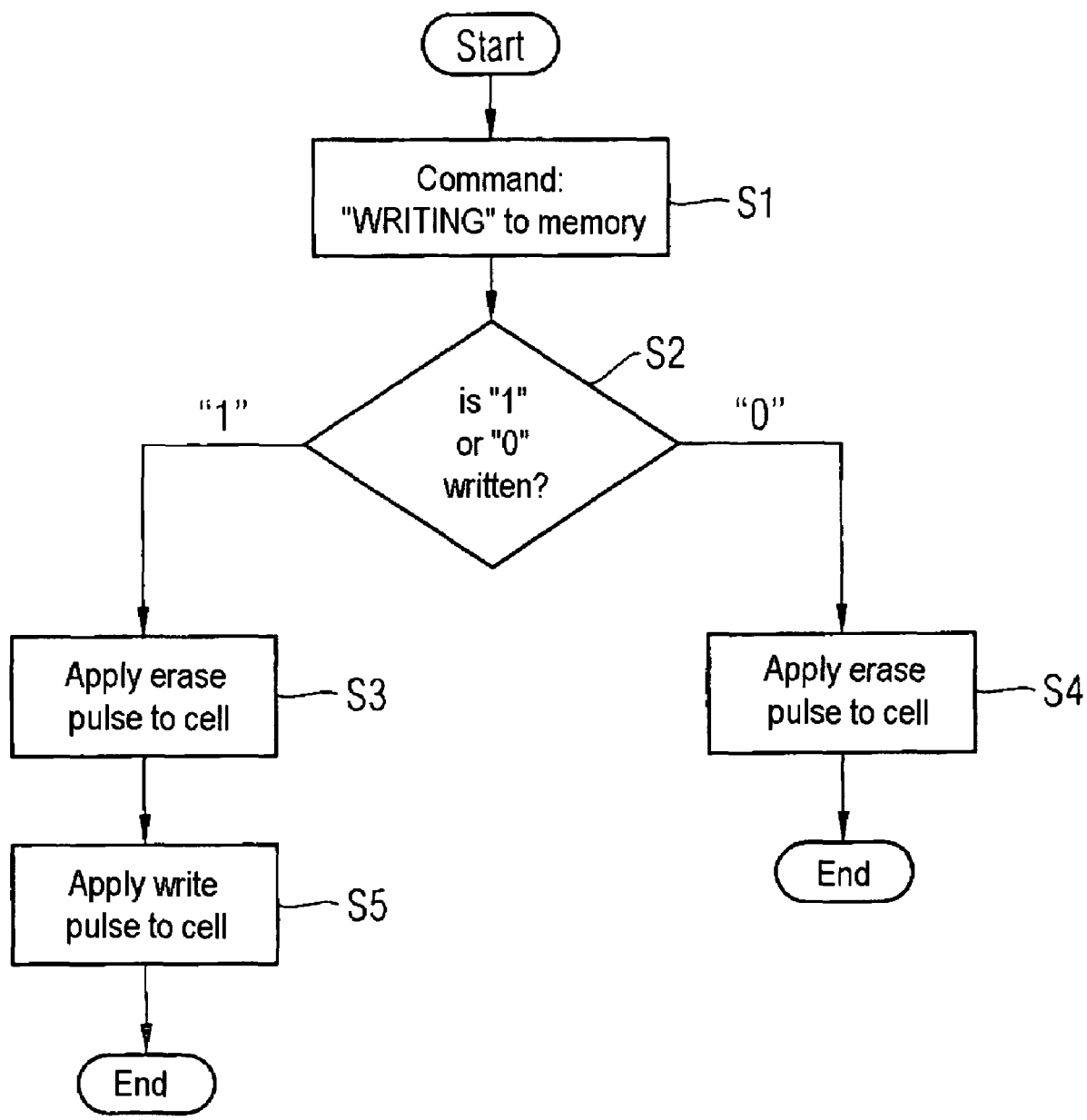
FIG. 4 shows a schematic flow diagram of an exemplary embodiment of a programming method according to the invention.
Figure 6:
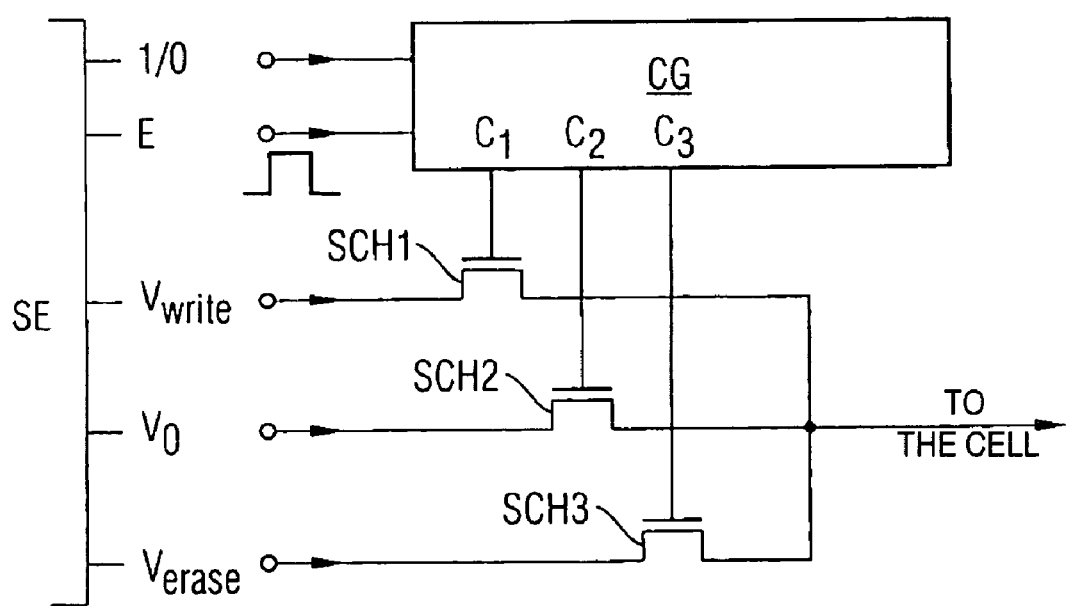
FIG. 6 shows a programming device designed for carrying out the programming method corresponding to the first aspect of the invention, as shown by the flow diagram in FIG. 4.

The circuit arrangement illustrated schematically in FIG. 6 is a device for carrying out the programming method illustrated in the flow diagram of FIG. 4. This device includes an interface to a memory control unit SE, which outputs a write request I/O, an enable signal E, the potential $V_{write}$ for the write pulse, the potential $V_0$ for the center level and the potential $V_{erase}$ for the erase pulse. The programming device illustrated in FIG. 6 contains a command generator CG, which outputs command signals $C_1$, $C_2$ and $C_3$ depending on the signals fed to it by the memory control unit SE, FET transistors Sch1, Sch2 and Sch3 serving as switches respectively being opened and closed via the command signals. The outputs of these three switches are combined and, depending on the command signals $C_1$, $C_2$, $C_3$ of the command generator CG, pass the erase pulse with the potential $V_{erase}$, the write pulse with the potential $V_{write}$ and the center level to the cell. Consequently, the programming device illustrated in FIG. 6 has the effect that the command generator CG, upon reception of a write request signal I/O and an enable signal E from the memory control unit SE, in the write cycle, outputs the command signals $C_1$, $C_2$ and $C_3$ which correspond to the input signals and which a respective one of the switches Sch1, Sch2 and Sch3 is opened or closed. The switches Sch1, Sch2 and Sch3 respectively have applied to them a level $V_{write}$ corresponding to the write pulse, the center level $V_0$ and the level $V_{erase}$ corresponding to the erase pulse and, on the basis of these levels or potentials, pass the write pulse and erase pulse and the center level to the cell as required by the method described above and illustrated in the flow diagram of FIG. 4.

FIG. 7A shows a schematic circuit diagram of a programming device for programming CBRAM memory cells which corresponds to another embodiment of the invention. An evaluation logic has a NAND element 2, to which are applied on the input side a write request signal W received externally or from a memory control unit (not shown) and a read signal R generated by a sense amplifier (SA). The NAND element 2 performs a logic NAND combination of these two input signals R and W according to the truth table shown in the three left-hand columns in FIG. 7B. This signal logically combined by the NAND element 2 is present at a first input of a first AND element 3, the second input of which is fed an enable signal E either externally or from a memory control unit. The signal generated at the output of the first AND element 3 is then additionally logically combined with the write request W from the input I/O via a second AND element 4, which generates an output signal "OUT" as contained in the right-hand column of the truth table shown in FIG. 7B. Consequently, the output signal "OUT" is generated by the programming device shown in FIG. 7A only when the cell state read from the cell and detected by the sense amplifier 1 according to the signal R differs from the state of the write request W.

The pulse diagrams of FIG. 7C respectively show (left-hand-side) the write pulse generated for programming a logic "1" at the output "OUT" of the circuit shown in FIG. 7A, which write pulse is generated only if the input signals R and W of the NAND element 2 have different states, and (right-hand side) an erase pulse applied in all other cases of the cell. The write pulse "1" and erase pulse "0" are voltage pulses and have opposite polarities, proceeding from a zero or center level that is not specifically designated in FIG. 7C.

Figure 7D:
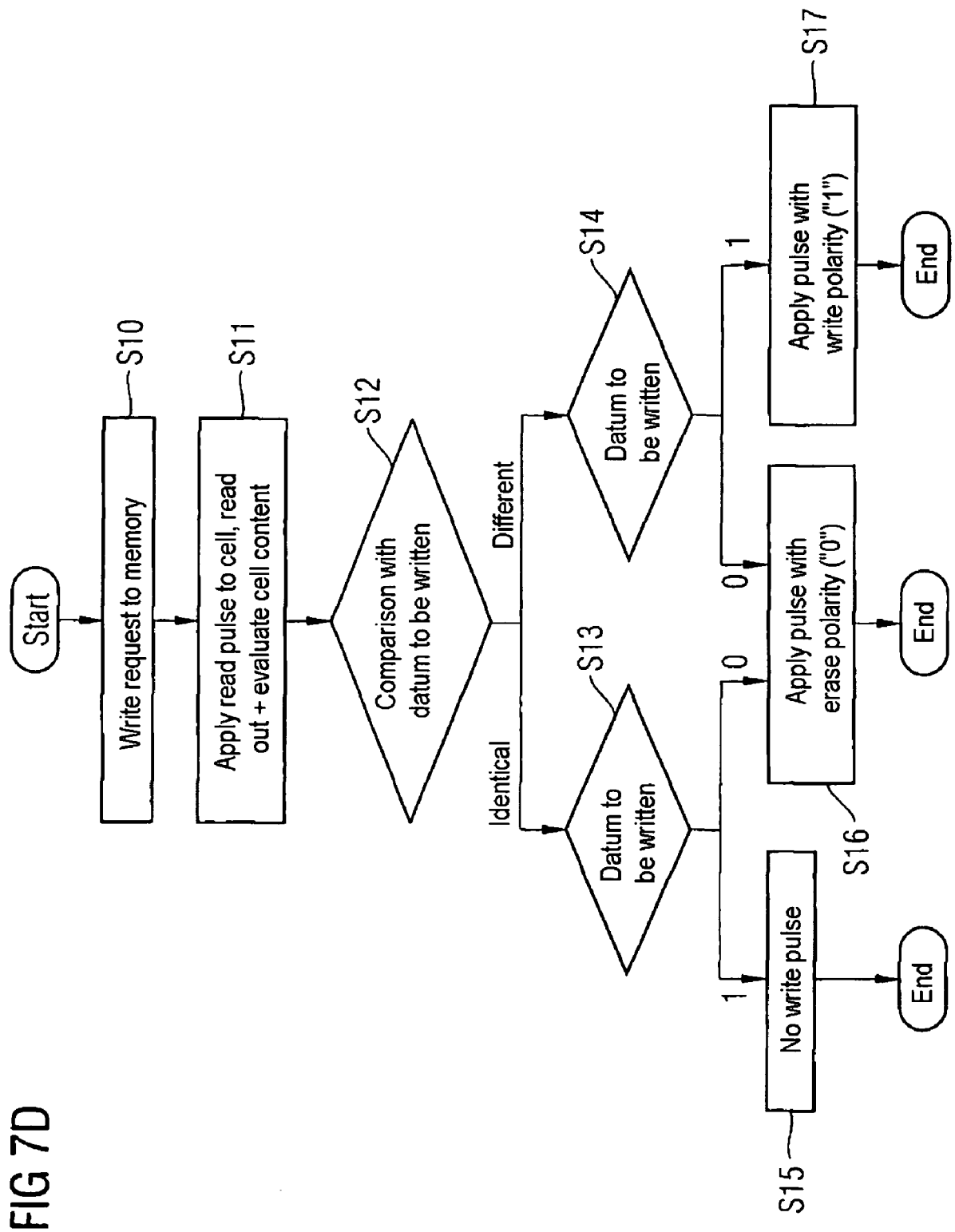
FIG. 7D shows a flow diagram illustrating the mode of functioning of the programming device illustrated in FIG. 7A.

FIG. 7D shows, in the form of a schematic flow diagram, the mode of functioning of the programming device illustrated in FIG. 7A. After the write command has been sent to the memory (S10), a read pulse is applied to the memory cell, and the cell content is read out and evaluated for example by the sense amplifier 1 shown in FIG. 7A (S11). With S12, the write request signal (W) is evaluated, i.e., compared, with the evaluated cell content signal (R) by the NAND element 2.

If both input signals R and W present at the NAND element 2 are identical, it is the case that, if the datum to be written corresponds to a logic "1", i.e., interrogation (S13), nothing further is instigated, i.e., no write pulse is output (S15). If the datum to be written corresponds to a logic "0", an erase pulse is applied (S16).

By contrast, if the two input signals R and W at the NAND element 2 are different, interrogation (S14) assesses whether writing of the datum corresponds to a logic "0" or "1". An erase pulse is applied in the first case (S16) and a write pulse is applied in the second case (S17).

In the circuit arrangement which is shown schematically in FIG. 8A and represents a programming device corresponding to another exemplary embodiment of the invention, the NAND element 2 in the evaluation logic (FIG. 7A) has been replaced by an exclusive-OR element 12, while the other components, input signals and signal connections correspond to the circuit arrangement shown in FIG. 7A.

Figure 8D:
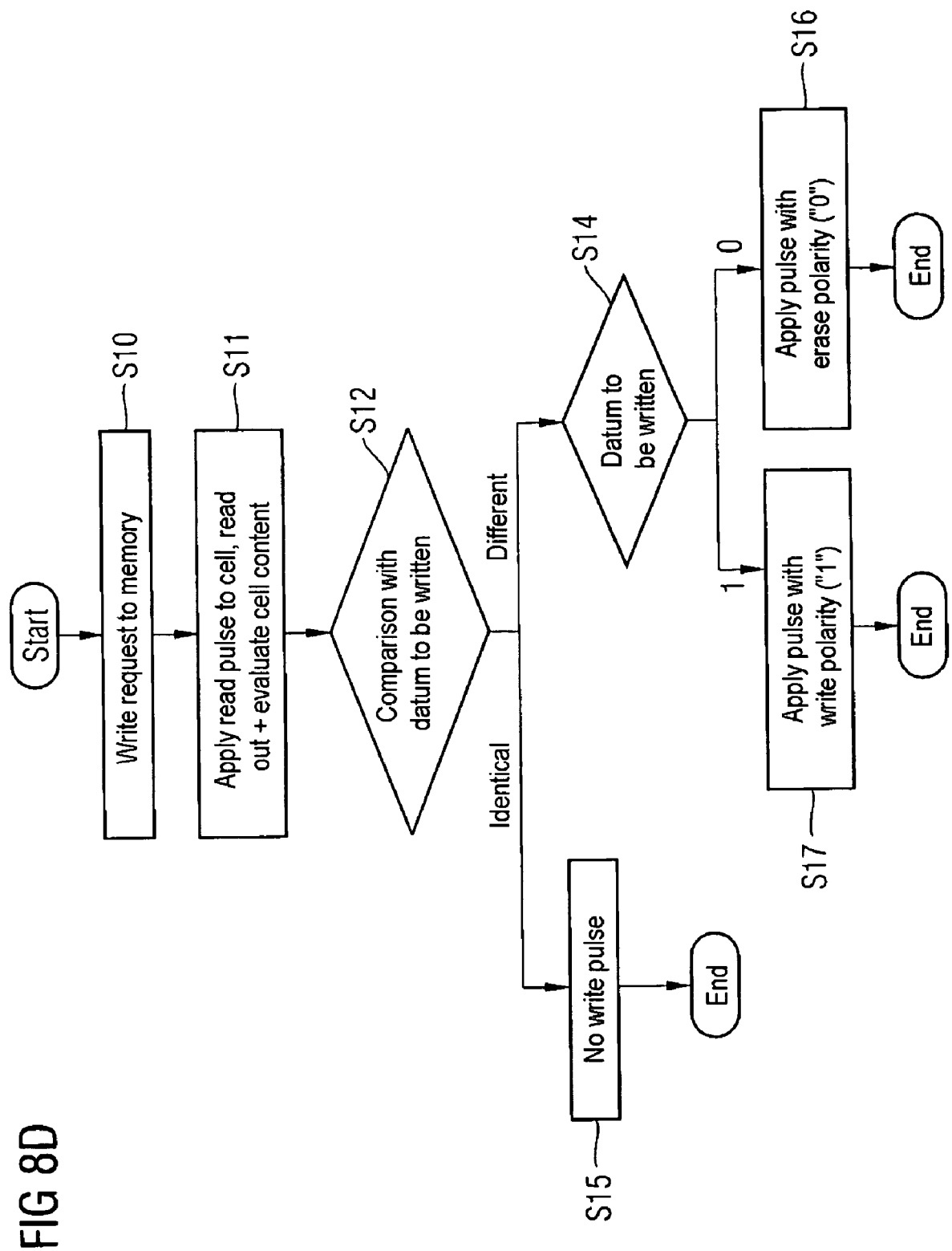
FIG. 8D shows a schematic flow diagram illustrating the mode of functioning of the programming device as illustrated in FIG. 8A.

The different mode of functioning—illustrated schematically in the form of a flow diagram in FIG. 8D—of the programming device illustrated in FIG. 8A is explained on the basis of the truth table shown in FIG. 8B and the pulse diagram shown in FIG. 8C, which does not differ from that in FIG. 7C. Specifically, the function of the exclusive-OR element 12 contained in the evaluation circuit prevents the memory cell from being overwritten if a datum to be written corresponds to the present state of the cell. Firstly, S10-S12 of FIG. 8D are identical to S10-S12 of FIG. 7D. If the comparison in S12 reveals that a write datum is identical to the present content of the cell, nothing further is instigated, to be precise irrespective of whether a datum to be written corresponds to a logic "1" or "0". By contrast, if the comparison (S12), carried out by the exclusive-OR element 12, reveals that the datum to be written differs from the present state of the memory cell, it is the case that, depending on the logic state of the write datum determined in S14, a write pulse for writing a logic "1" is applied (S17) or in the other case an erase pulse for erasing the cell content of the memory cell is applied (S16).

The programming device of the invention as explained with reference to FIGS. 7A-7D has the advantage over the programming device according to the invention as explained above with reference to FIGS. 8A-8D that the high-resistance "0" state is always updated or "refreshed" by the device of FIG. 7A.

In the case of the programming devices described above it was assumed by way of example that the write pulse and erase pulse are voltage pulses each having an identical duration and approximately identical amplitude. Since this presumption is only by way of example, however, the programming device claimed by the independent claims is also intended to encompass, for write and erase pulses, current pulses and pulses each having a different duration and amplitude.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SIGNS

I CBRAM memory cell
"0", "1" Logic states
I/O Write request
E Enable signal
$V_{write}$ Level of the write pulse
$V_{erase}$ Level of the erase pulse
$V_0$ Center level
$C_1, C_2, C_3$ Command signals
Sch1, Sch2, Sch3 Switches
R Read state of the memory cell
W Signal of the write request
"OUT" Output signal to the cell
SA Sense amplifier
S1-S5 Command steps of a first exemplary embodiment
S10-S17 Command steps of a second exemplary embodiment

What is claimed is:

1. An integrated circuit having resistive memory cells in which the memory cells are capable of being put into a low-resistance or on state corresponding to a first logic state by application of a write pulse having a specific polarity and into a high-resistance or off state corresponding to a second logic state by application of an erase pulse having an opposite polarity, comprising:

a circuit configured to compare a cell content read out from a resistive memory cell that is to be written to with data to be stored in the resistive memory cell, and to supply the erase pulse to the resistive memory cell, independent of the comparison by the circuit, in the event that the data to be stored corresponds to the second logic state, and to supply the write pulse for writing data corresponding to the first logic state in response to the comparison revealing that a logic value of the cell content read out differs from the data to be stored.

2. The integrated circuit of claim 1, wherein the circuit comprises a NAND element suitable for carrying out a logic NAND operation with cell content read out and the data to be stored.

3. The integrated circuit of claim 1, wherein the write pulse and the erase pulse are voltage pulses.

4. A method for programming CBRAM memory cells capable of being put into a low-resistance or on state corresponding to a first logic state by application of a write pulse having a specific polarity and into a high-resistance or off state corresponding to a second logic state by application of an erase pulse having an opposite polarity, the method comprising:

comparing a cell content read out from a memory cell that is to be written to with data to be stored in the memory cell; and performing a memory cycle wherein the memory cell is supplied the erase pulse, independent of the comparison, in the event that the data to be stored corresponds to the second logic state, and wherein the memory cell is supplied the write pulse for writing data corresponding to the first logic state in response to the comparison revealing that the cell content differs from the data to be stored.

5. The method as claimed in claim 4, wherein the write pulse and the erase pulse are current pulses.

6. The method as claimed in claim 4, wherein the write pulse and the erase pulse are voltage pulses.

7. The method as claimed in claim 4, wherein the duration of the erase pulse is substantially equal to the duration of the write pulse.

8. The method as claimed in claim 4, wherein the duration of the erase pulse is longer than the duration of the write pulse.

9. The method as claimed in claim 4, wherein an amplitude of the erase pulse is substantially equal to an amplitude of the write pulse.

10. The method as claimed in claim 4, wherein an amplitude of the erase pulse is higher than an amplitude of the write pulse.

11. The integrated circuit of claim 1, wherein the resistive memory cells comprise CBRAM memory cells.

12. The integrated circuit of claim 1, wherein the write pulse and the erase pulse are current pulses.

13. The integrated circuit of claim 1, wherein a duration of the erase pulse is substantially equal to a duration of the write pulse.

14. The integrated circuit of claim 1, wherein a duration of the erase pulse is longer than a duration of the write pulse.

15. The integrated circuit of claim 1, wherein an amplitude of the erase pulse is substantially equal to an amplitude of the write pulse.

16. The integrated circuit of claim 1, wherein an amplitude of the erase pulse is higher than an amplitude of the write pulse.

17. An integrated circuit comprising:

a resistive memory cell configured to be programmed to a low-resistance state in response to a first pulse and to a high-resistance state in response to a second pulse; and a circuit configured to compare a resistance state of the memory cell to a resistance state to be programmed to the memory cell, and to supply the second pulse to the memory cell independent of the comparison in response to the resistance state to be stored corresponding to the high-resistance state, and to supply the first pulse to the memory cell in response to the resistance state of the memory cell differing from the resistance state to be programmed to the memory cell.

18. The integrated circuit of claim 17, wherein the first pulse has a polarity opposite the second pulse.

19. The integrated circuit of claim 17, wherein the resistive memory cell comprises a CBRAM memory cell.

20. The integrated circuit of claim 17, wherein an amplitude and duration of the first pulse is substantially equal to an amplitude and duration of the second pulse.

* * * * *